(12) United States Patent
Cheng et al.

(10) Patent No.: US 12,557,565 B2
(45) Date of Patent: Feb. 17, 2026

(54) PHASE CHANGE MEMORY WITH REDUCED PROGRAMMING CURRENT

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Zuoguang Liu, Schenectady, NY (US); Arthur Gasasira, Halfmoon, NY (US)

(73) Assignee: International Business Machines Corporation, Armonk, NY (US)

( * ) Notice: Subject to any disclaimer, the term of this patent is extended or adjusted under 35 U.S.C. 154(b) by 686 days.

(21) Appl. No.: 17/653,309

(22) Filed: Mar. 3, 2022

(65) Prior Publication Data
US 2023/0284543 A1 Sep. 7, 2023

(51) Int. Cl.
*H10N 70/00* (2023.01)
*H10N 70/20* (2023.01)

(52) U.S. Cl.
CPC ....... *H10N 70/8413* (2023.02); *H10N 70/021* (2023.02); *H10N 70/041* (2023.02); *H10N 70/231* (2023.02); *H10N 70/8828* (2023.02)

(58) Field of Classification Search
CPC ............. H10N 70/8413; H10N 70/021; H10N 70/041; H10N 70/231; H10N 70/8828; H10N 70/821; H10N 70/8822; H10N 70/8825; H10N 70/011

See application file for complete search history.

(56) References Cited

U.S. PATENT DOCUMENTS

| 7,687,794 | B2 | 3/2010 | Liu | |
|---|---|---|---|---|
| 7,732,798 | B2 | 6/2010 | Elmegreen | |
| 8,426,967 | B2 | 4/2013 | Joseph | |
| 2009/0026432 | A1* | 1/2009 | Liu | H10N 70/8413 257/E21.09 |
| 2009/0039331 | A1* | 2/2009 | Clevenger | H10N 70/884 257/E47.001 |
| 2009/0184307 | A1* | 7/2009 | Yoon | H10N 70/231 438/102 |
| 2009/0309087 | A1* | 12/2009 | Lung | H10N 70/066 257/E47.001 |

(Continued)

FOREIGN PATENT DOCUMENTS

| KR | 100861296 B1 | 10/2008 |
|---|---|---|
| KR | 100881055 B1 | 1/2009 |
| WO | 2012138615 A2 | 10/2012 |

OTHER PUBLICATIONS

Hasan Hayat et al., "Can conventional phase-change memory devices be scaled down to single-nanometre dimensions?", 2017, Nanotechnology, 28 024202 (Year: 2017).*

(Continued)

*Primary Examiner* — Teresa M. Arroyo
(74) *Attorney, Agent, or Firm* — Jeffrey M. Ingalls

(57) ABSTRACT

A semiconductor device is provided. The semiconductor device includes a heater formed on a substrate; a hardmask formed on the heater; a phase change material layer formed on a first side of the heater and the hardmask; a first electrode formed on the phase change material layer on the first side; and a second electrode formed on the substrate on a second side of the heater and the hardmask.

18 Claims, 5 Drawing Sheets

(56) References Cited

U.S. PATENT DOCUMENTS

| | | | | |
|---|---|---|---|---|
| 2010/0065530 A1* | 3/2010 | Walker | ............. | H01L 21/32134 |
| | | | | 252/79.3 |
| 2014/0264228 A1* | 9/2014 | Toh | ................... | H10N 70/823 |
| | | | | 257/4 |
| 2019/0305220 A1* | 10/2019 | Jha | ................... | G11C 13/0069 |
| 2020/0411087 A1* | 12/2020 | Cheng | ............... | G11C 13/0004 |
| 2021/0135104 A1* | 5/2021 | Ok | ................... | H10N 70/8265 |
| 2021/0305507 A1* | 9/2021 | Cheng | ................... | H01L 23/12 |
| 2023/0093026 A1* | 3/2023 | Philip | ................... | H10B 63/00 |
| | | | | 257/4 |
| 2023/0189667 A1* | 6/2023 | Cheng | ................. | H10N 70/011 |
| | | | | 257/4 |
| 2023/0284541 A1* | 9/2023 | Philip | ............... | H10N 70/8828 |
| | | | | 257/4 |

OTHER PUBLICATIONS

Syed Ghazi Sarwat et al., "Projected Mushroom Type Phase-Change Memory", 2021, Advanced Functional Materials, 31 2106547 (Year: 2021).*

* cited by examiner

PHASE CHANGE MEMORY WITH REDUCED PROGRAMMING CURRENT

BACKGROUND

The present disclosure generally relates to fabrication methods and resulting structures for semiconductor-based electronic devices. More specifically, the present disclosure relates to a phase-change memory (PCM) device and a method of manufacturing a PCM device.

Phase-change memory (PCM) structures are a type of memory device that is considered for analog computing. PCM is an emerging non-volatile (NV) random-access (RAM) which offers some advantage over existing non-volatile memories (NVMs). It has potential for both classic memory applications and neuromorphic computing.

In a PCM, a phase change material is formed between two electrodes, and the resistance can change via a phase change, and this change in resistance is reversible. The PCM is heated for a relatively short time and quickly cooled to become an amorphous state, which achieves high resistance. The PCM is heated at a lower temperature but for a relatively long time to become a crystalline state, which achieves low resistance.

One of the considerations for PCM devices is their programming current, which can be very large during the power-intensive reset step. Heat loss, heating efficiency, and the reset current may be topics of interest regarding the performance of PCM devices.

SUMMARY

Embodiments of the present disclosure relate to a phase change memory (PCM) device is provided. The PCM semiconductor device includes a heater formed on a substrate; a hardmask formed on the heater; a phase change material layer formed on a first side of the heater and the hardmask; a first electrode formed on the phase change material layer on the first side; and a second electrode formed on the substrate on a second side of the heater and the hardmask.

Embodiments of the present disclosure relate to a method of manufacturing a phase change memory (PCM) device. The method includes: forming a heater on a substrate; forming a hardmask on the heater; forming a phase change material layer on a first side of the heater and the hardmask; forming a first electrode on the phase change material layer on the first side; and forming a second electrode on the substrate on a second side of the heater and the hardmask.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

DETAILED DESCRIPTION

Figure 1:
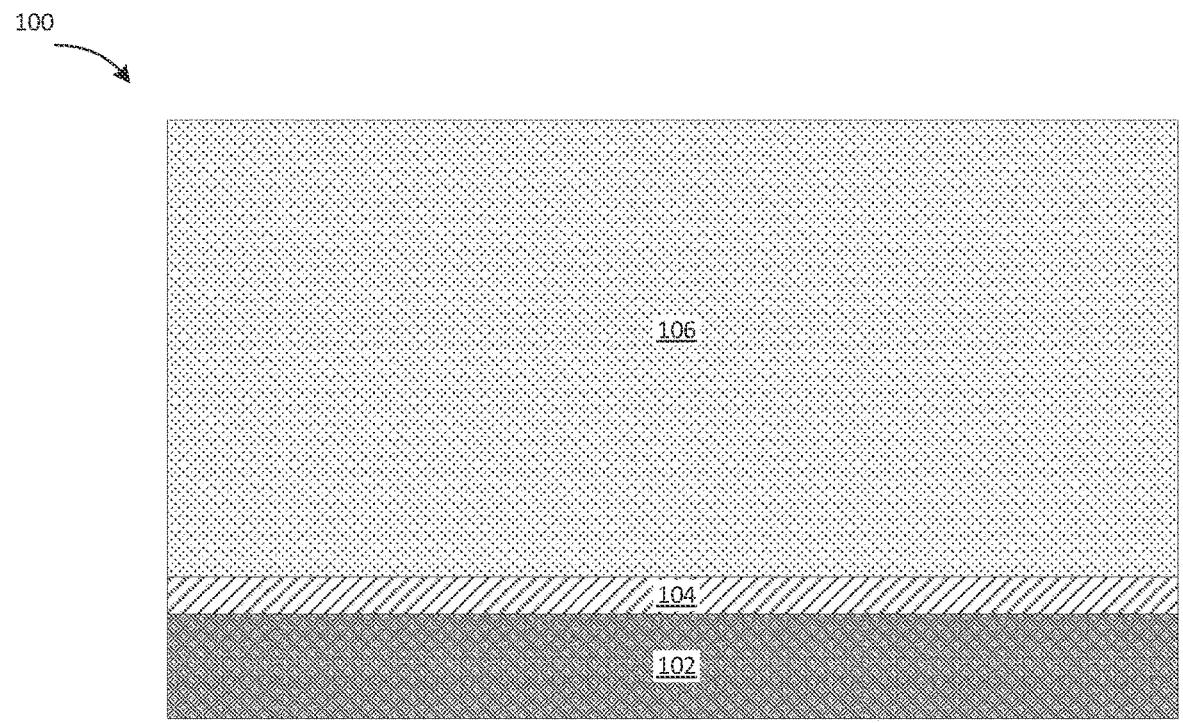
FIG. 1 is a cross-sectional view of a PCM memory cell semiconductor device at an intermediate stage of the manufacturing process, according to embodiments.

The present disclosure generally relates to fabrication methods and resulting structures for semiconductor-based electronic devices. In particular, the present disclosure relates to phase-change memory (PCM) devices and PCM memory cells and methods of manufacturing the same.

The flowcharts and cross-sectional diagrams in the Figures illustrate methods of manufacturing the hybrid memory cells according to various embodiments. In some alternative implementations, the manufacturing steps may occur in a different order than that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on," or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating, or semiconductor layers at the interface of the two elements. It should be noted the term "selective to," such as, for example, "a first element selective to a second element," means that a first element can be etched, and the second element can act as an etch stop.

For the sake of brevity, conventional techniques related to a semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known, and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping, and patterning/lithography. A deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD), among others. Removal/etching is any process that removes material from the wafer. Examples include etch processes (either wet or dry), chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light-sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns, and slowly the conductors, insulators, and selectively doped regions are built up to form the final device.

Turning now to an overview of technologies that are more specifically relevant to aspects of the present disclosure, phase-change memory (also known as PCM, PCME, PRAM, PCRAM, OUM (ovonic unified memory), and C-RAM or CRAM (chalcogenide RAM)) is a type of non-volatile random-access memory. PMCs exploit the unique behavior of chalcogenide glass. Phase change materials, such as chalcogenides, can be caused to change the phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials in PCM devices are capable of being switched between a first structural state in which the material is in a generally amorphous solid phase and a second structural state in which the material is in a generally crystalline solid phase in the active region of the cell. The term "amorphous" is used to refer to a relatively less ordered structure, more disordered than a single crystal, which has detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density, and activation energy. The material can be switched into either different solid phases or mixtures of two or more solid phases, providing a grayscale between completely amorphous and completely crystalline states.

The change from the amorphous to the crystalline state in PCM devices is generally a lower current operation, requiring a current that is sufficient to raise the phase change material to a level between a phase transition temperature and a melting temperature. The change from crystalline to amorphous referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous state. It is desirable to minimize the magnitude of the reset current used to cause the transition of phase change material from a crystalline state to an amorphous state. The magnitude of the needed reset current can be reduced by reducing the volume of the active region in the phase change material element in the cell.

Mushroom-shaped phase-change memory (PCM) may be utilized in certain machine learning applications. An Artificial Neural Network (ANN) (also referred to as a neural network) is a computing system made up of a number of simple, highly interconnected processing elements (nodes), which process information by their dynamic state response to external inputs. ANNs are processing devices (algorithms and/or hardware) that are loosely modeled after the neuronal structure of the mammalian cerebral cortex but on much smaller scales. A large ANN might have hundreds or thousands of processor units, whereas a mammalian brain has billions of neurons with a corresponding increase in the magnitude of their overall interaction and emergent behavior. A feedforward neural network is an artificial neural network where connections between the units do not form a cycle. A deep learning neural network (DNN) is an artificial neural network (ANN) with multiple hidden layers of units between the input and output layers. Similar to shallow ANNs, DNNs can model complex non-linear relationships. DNN architectures, e.g., for object detection and parsing, generate compositional models where the object is expressed as a layered composition of image primitives. The extra layers enable the composition of features from lower layers, giving the potential of modeling complex data with fewer units than a similarly performing shallow network. DNNs are typically designed as feedforward networks. Machine learning, which is a subset of AI, utilizes algorithms to learn from data (e.g., Big Data) and create foresight based on this data. AI refers to the intelligence when machines, based on information, are able to make decisions, which maximizes the chance of success in a given topic. More specifically, AI is able to learn from a data set to solve problems and provide relevant recommendations. AI is a subset of cognitive computing, which refers to systems that learn at scale, reason with purpose, and naturally, interact with humans. Cognitive computing is a mixture of computer science and cognitive science. Cognitive computing utilizes self-teaching algorithms that use data, visual recognition, and natural language processing to solve problems and optimize processes. In certain examples, the PCM devices of the present embodiments may be used to represent weights of a neural network for artificial intelligence (AI) applications.

Embodiments in accordance with the present disclosure provide methods and devices for employing a PCM-based memory device with a half mushroom-shaped phase change area. The half mushroom shape generally corresponds to about one-quarter of the volume of a sphere. Related PCM memory devices have a conventional full mushroom shaped cell, and that may require a relatively large programming current compared to the present embodiments. A large programming current may result in high power consumption, and/or the need for a large transistor to deliver the high current to PCM, resulting in a large PCM cell size. In general, the PCM layer or material above or adjacent to the heater is melted by joule heating. The resistance depends on phase change material properties as well as the distance (d) between the edge of the heater to the edge of the amorphous dome (which corresponds to the mushroom shaped cell). Moreover, the energy required to melt the PCM cell is proportional to the volume of the amorphous dome ($\sim d^3$). The present embodiments may allow for a reduction in the amount of energy required to melt the PCM cell by reducing the volume of the amorphous dome. The present embodiments provide a lateral mushroom shaped cell with only about half of the mushroom PCM material needed to melt while still achieving a comparable reset resistance. With a relatively smaller volume of PCM material to be melted, less current (energy) is required, and therefore a smaller transistor may be used (which translates to a smaller PCM cell size).

Referring now to the drawings in which like numerals represent the same or similar elements and initially to FIG. 1, an exemplary method of manufacturing a PCM memory cell 100 to which the present embodiments may be applied is shown. As shown in FIG. 1, a base semiconductor substrate 102. In certain embodiments, the semiconductor substrate includes a semiconductor material including, but not limited to, silicon (Si), silicon germanium (SiGe), silicon carbide (SiC), Si:C (carbon-doped silicon), silicon germanium carbide (SiGeC), carbon-doped silicon germanium (SiGe:C), II-V compound semiconductor or another like semiconductor. In addition, multiple layers of the semiconductor materials can be used as the semiconductor material of the substrate. The semiconductor substrate can be a bulk substrate or a semiconductor-on-insulator substrate such as, but not limited to, a silicon-on-insulator (SOI), silicon-germanium-on-insulator (SGOI), or III-V-on-insulator substrate including a buried insulating layer, such as, for example, a buried oxide or nitride layer. There may be any suitable number of intermediate layers between the substrate 102 and the heater 104, and in FIG. 1, the substrate 102 is shown as the bottom layer for the sake of simplicity and ease of illustration. The substrate 102 may also include one or more other devices such as transistors, isolation structures, contacts, wires, etc.

As shown in FIG. 1, a heater 104 (also referred to as a heating element, or heating layer, or nanoheater) is formed. Initially, the heater 104 may be formed as a uniform layer. In certain embodiments, some examples of heater 104 materials can include, but are not limited to, titanium nitride (TiN), silicon carbide (SiC), graphite, tantalum nitride (TaN), tungsten nitride (WN), titanium tungsten (TiW), or titanium aluminide (TiAl) or any other suitable electrically conducting material. The heater 104 may be formed of a thickness of about 5 nm, for example. However, it should be appreciated that the heater 104 may be formed on any other suitable material(s) and may be formed to a different thickness. The heater 104 may be formed as a square, rectangular, or stripe shape (e.g., a nanowire), for example.

Then, as shown in FIG. 1, a hardmask 106 is formed over the heater 104 (e.g., initially as a uniform layer). In certain examples, the hardmask 106 can include a nitride-containing material, such as, e.g., a silicon nitride material (e.g., SiN, a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof). However, the hardmask 106 can include any suitable dielectric material that can be deposited by, e.g., chemical vapor deposition (CVD) and related methods. Other compositions for the mask include, but are not limited to, silicon oxides, silicon carbides, etc. Spin-on dielectrics that can be utilized as a material for the mask can include but are not limited to: silsequioxanes, siloxanes, and boron phosphate silicate glass (BPSG).

Figure 2:
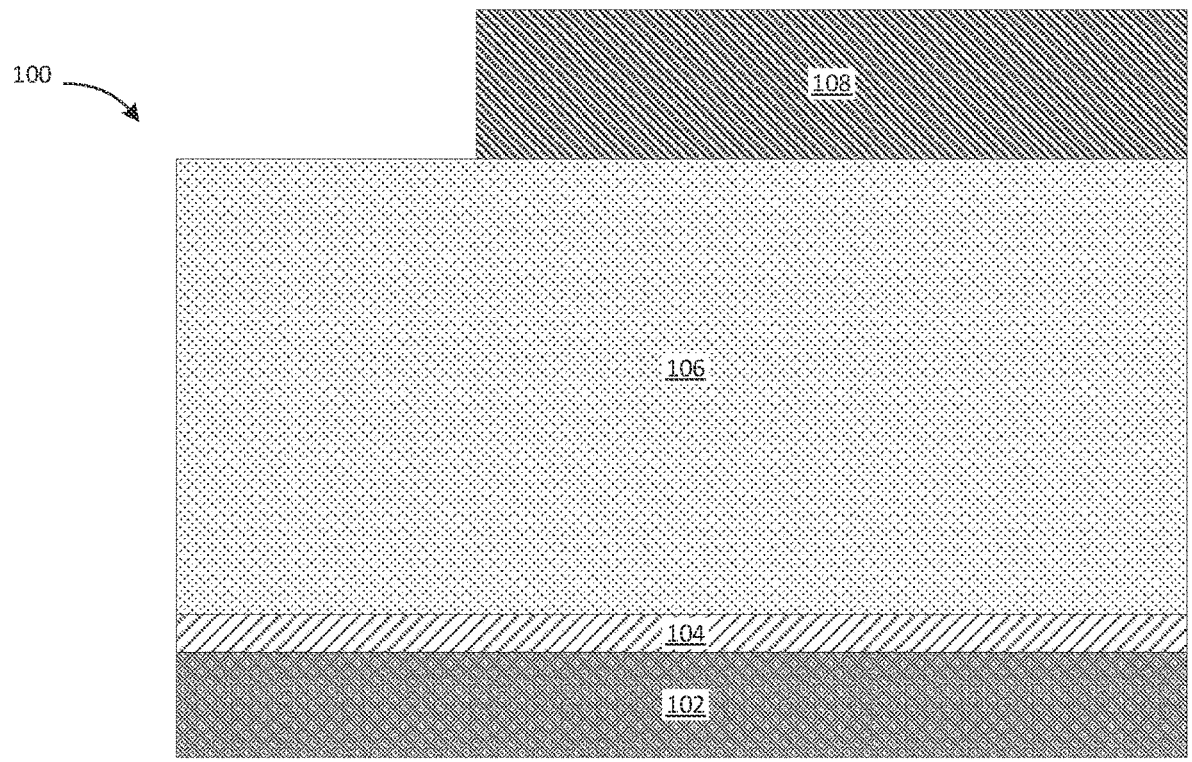
FIG. 2 is a cross-sectional view of the semiconductor device of FIG. 1 after additional fabrication operations, according to embodiments.

In certain embodiments, as shown in FIG. 2, a first mask 108 may be formed over the hardmask 106 to allow for subsequent patterning of the hardmask 106 and the heater 104. In certain examples, the first mask 108 can include soft and/or hardmask materials and can be formed using deposition, photolithography, and etching.

Figure 3:
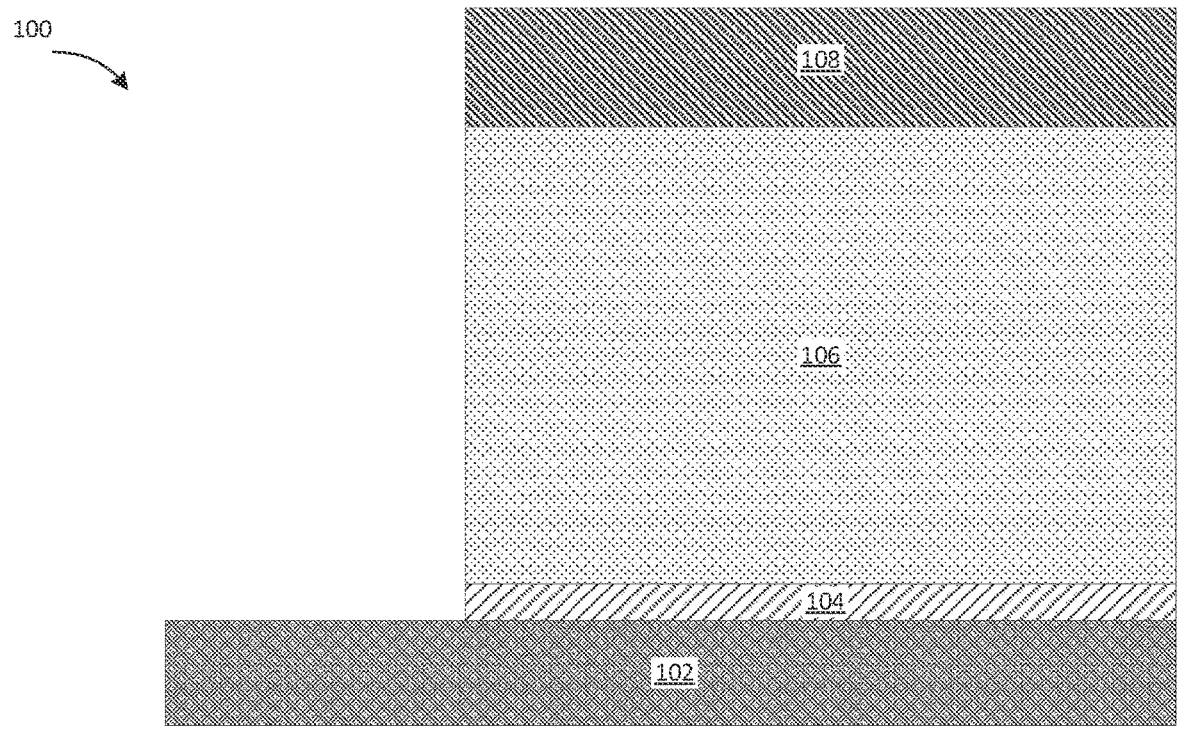
FIG. 3 is a cross-sectional view of the semiconductor device of FIG. 2 after additional fabrication operations, according to embodiments.

Referring now to FIG. 3, this figure is a cross-sectional view of the semiconductor device of FIG. 2 after additional fabrication operations, according to embodiments. As shown in FIG. 3, the hardmask 106 and the heater 104 are patterned using the first mask 108. These layers may be patterned, and any suitable material removal process (e.g., reactive ion etching or RIE) may be used to form the structure shown in FIG. 2. In other examples, a two-step etching process may be performed that includes first etching the SiN hardmask 106 layer (e.g., with RIE) and stopping on the TiN heater 106, then secondly etching the heater 104.

Figure 4:
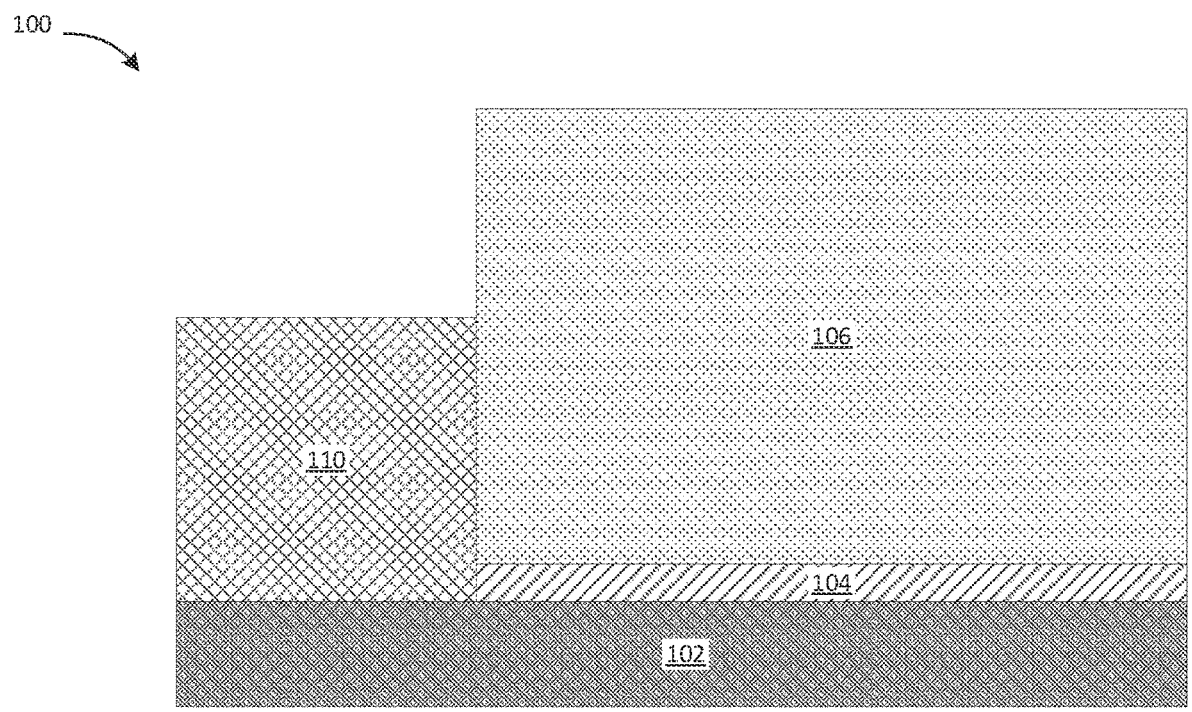
FIG. 4 is a cross-sectional view of the semiconductor device of FIG. 3 after additional fabrication operations, according to embodiments.

Referring now to FIG. 4, this figure is a cross-sectional view of the semiconductor device of FIG. 3 after additional fabrication operations, according to embodiments. As shown in FIG. 4, phase change memory (PCM) layer 110 is formed on the substrate 102 in the area where the material was removed in the prior material removal process. In this example, the height of the PCM layer 110 is less than a height of the upper surface of the hardmask 106. In certain PCM memory devices, heat produced by the passage of an electric current through a heating element (i.e., the heater 104), generally made of titanium nitride, may be used to either quickly heat and quench the glass (e.g., the phase change memory layer 110 shown in FIG. 4), making it amorphous, or to hold it in its crystallization temperature range for some time, thereby switching it to a crystalline state. In general, phase-change memories (PCMs) are based on the peculiar properties of chalcogenide materials, that is, compounds based on sulfur, selenium, or tellurium, such as GeSe, AsS, SbTe, and $In_2Se_3GeAsTe$, or GeSbTe (GST). The latter is the most frequently used material in PCMs, such as in the phase change layer 110 shown in FIG. 4. The phase change material can include a Ge—Sb—Te (germanium-antimony-tellurium or "GST", such as $Ge_2Sb_2Te_5$) alloy. Alternatively, other suitable materials for the phase change material include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase change material can further include nitrogen, carbon, and/or oxygen. In some embodiments, the phase change material can be doped with dielectric materials, including but not limited to aluminum oxide ($Al_2O_3$), silicon oxide ($SiO_2$), (tantalum oxide ($Ta_2O_5$), hafnium oxide ($HfO_2$), zirconium oxide ($ZrO_2$), cerium Oxide ($CeO_2$), silicon nitride (SiN), silicon oxynitride (SiON), etc. The phase change material of the phase change layer 110 can be deposited utilizing physical vapor deposition (PVD), magnetron-assisted sputtering, chemical vapor deposition (CVD), atomic layer deposition (ALD), evaporation, ion beam deposition, electron beam deposition, laser-assisted deposition, chemical solution deposition, or any other suitable deposition techniques. After deposition, the phase change material can be planarized, for example, by chemical mechanical polish (CMP).

Memory switching in these materials is primarily a thermal process, which involves a phase transformation from a crystalline to an amorphous state, and vice versa, under the influence of a heat source (i.e., the TiN layer or the heater 104). When the heating process stops, the material of the phase change layer 110 retains its new state, thus exhibiting memory (the SET operation). In practice, this transformation is achieved by passing a constant current through the sample for some time. The transition to an amorphous state (the RESET operation) occurs by resistive heating up to the local melting of the phase change layer 110. To switch back to the low resistance crystalline state (the SET operation), a lower and longer pulse may be applied. The resistance change between the two states is ~2-3 orders of magnitude, so that reading can easily be accomplished by low-bias nondestructive detection of the cell resistance.

Figure 5:
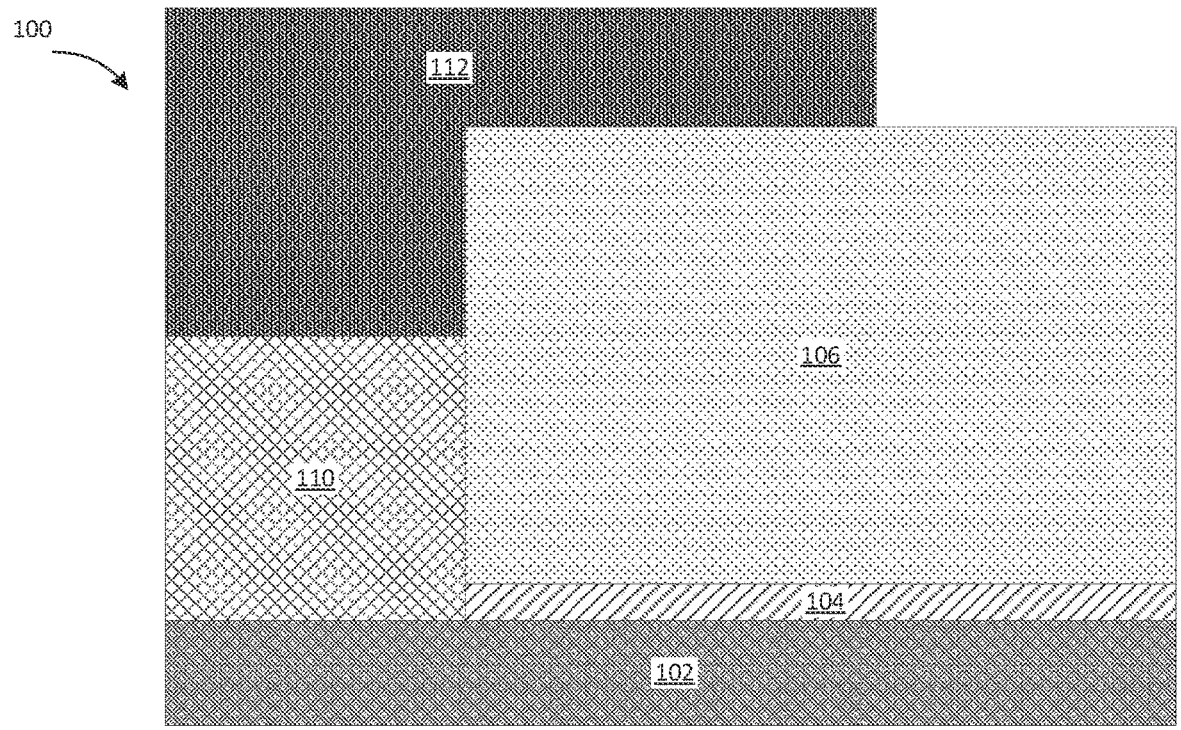
FIG. 5 is a cross-sectional view of the semiconductor device of FIG. 4 after additional fabrication operations, according to embodiments.

Referring now to FIG. 5, this figure is a cross-sectional view of the PCM memory cell 100 of FIG. 4 after additional fabrication operations, according to embodiments. As shown in FIG. 5, a second mask 112 is formed over the PCM layer 110 and over a portion of the hardmask 106. The second mask 112 is used for patterning the hardmask 106 and the heater 104 of the right side of the figure. In certain examples, the second mask 112 can include soft and/or hardmask materials and can be formed using deposition, photolithography, and etching.

Figure 6:
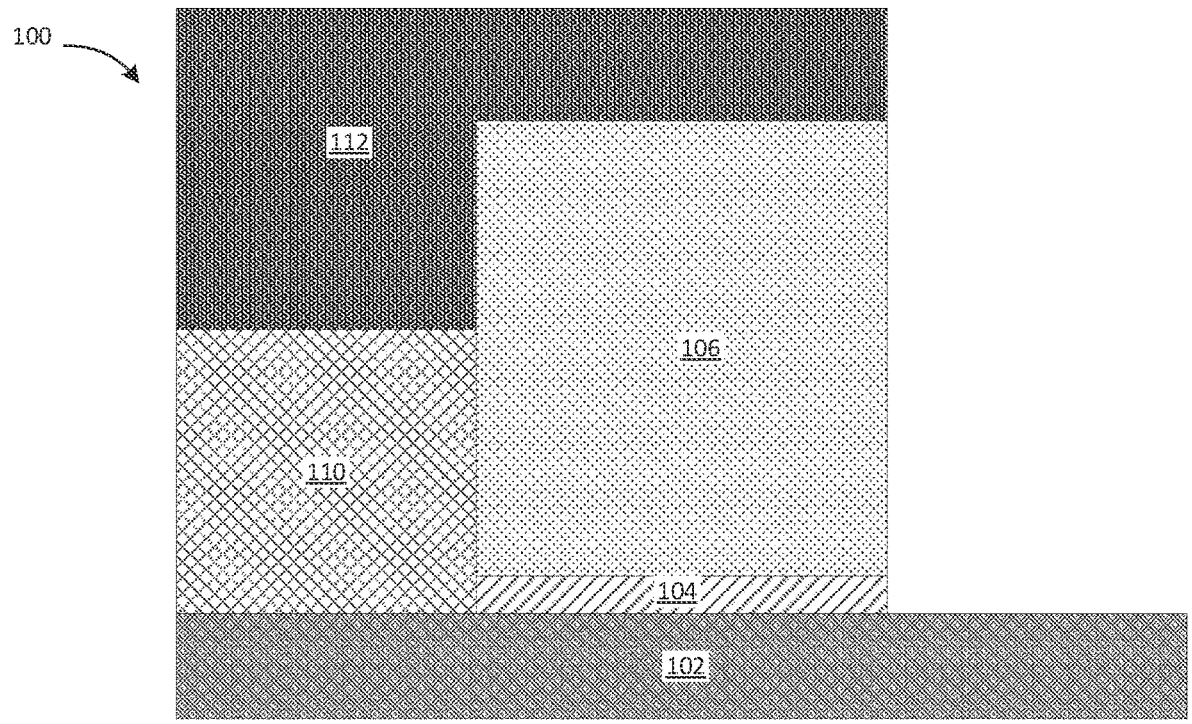
FIG. 6 is a cross-sectional view of the semiconductor device of FIG. 5 after additional fabrication operations, according to embodiments.

Referring now to FIG. 6, this figure is a cross-sectional view of the semiconductor device of FIG. 5 after additional fabrication operations, according to embodiments. As shown in FIG. 6, the hardmask 106 and the heater 104 are patterned using the second mask 112. These layers may be patterned, and any suitable material removal process (e.g., reactive ion etching or RIE) may be used to form the structure shown in FIG. 6. In other examples, a two-step etching process may be performed that includes first etching the SiN hardmask 106 layer (e.g., with RIE) and stopping on the TiN heater 106, then secondly etching the heater 104.

Figure 7:
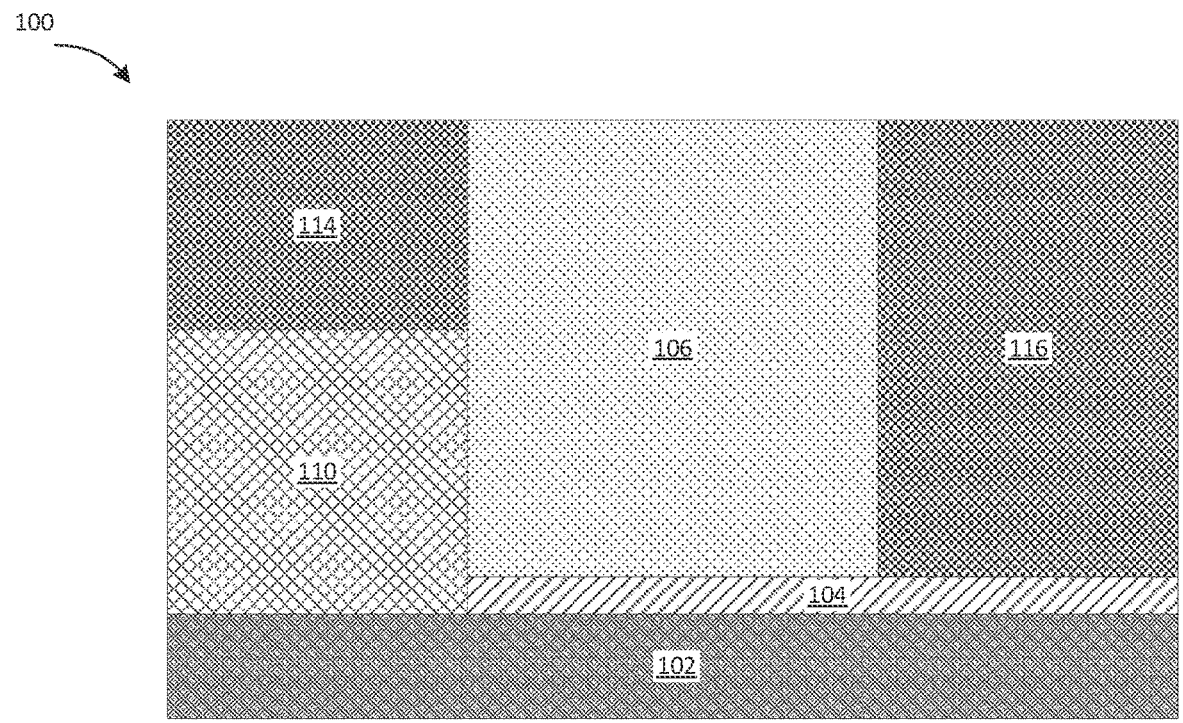
FIG. 7 is a cross-sectional view of the semiconductor device of FIG. 6 after additional fabrication operations, according to embodiments.

Referring now to FIG. 7, this figure is a cross-sectional view of the semiconductor device of FIG. 5 after additional fabrication operations, according to embodiments. As shown in FIG. 6, a first electrode 114 is formed on the PCM layer 110, and a second electrode 116 is formed on the substrate 102. The electrodes may serve as word lines or bit lines for the PCM memory cell 100 semiconductor device. The first electrode 114 and the second electrode 116 can include any suitable material in accordance with the embodiments described herein. Examples of suitable materials that can be included in the first electrode 114 and second electrode 116 include, but are not limited to, copper, titanium-based materials (e.g., titanium nitride materials (e.g., TiN)), tantalum-based materials (e.g., tantalum nitride materials (e.g., TaN)), and tungsten-based materials (e.g., W). In certain embodiments, first electrode 114 and the second electrode 116 are formed by first depositing and planarizing a conducting material (e.g., a TiN liner layer followed by a tungsten layer) to form the electrodes.

Figure 8:
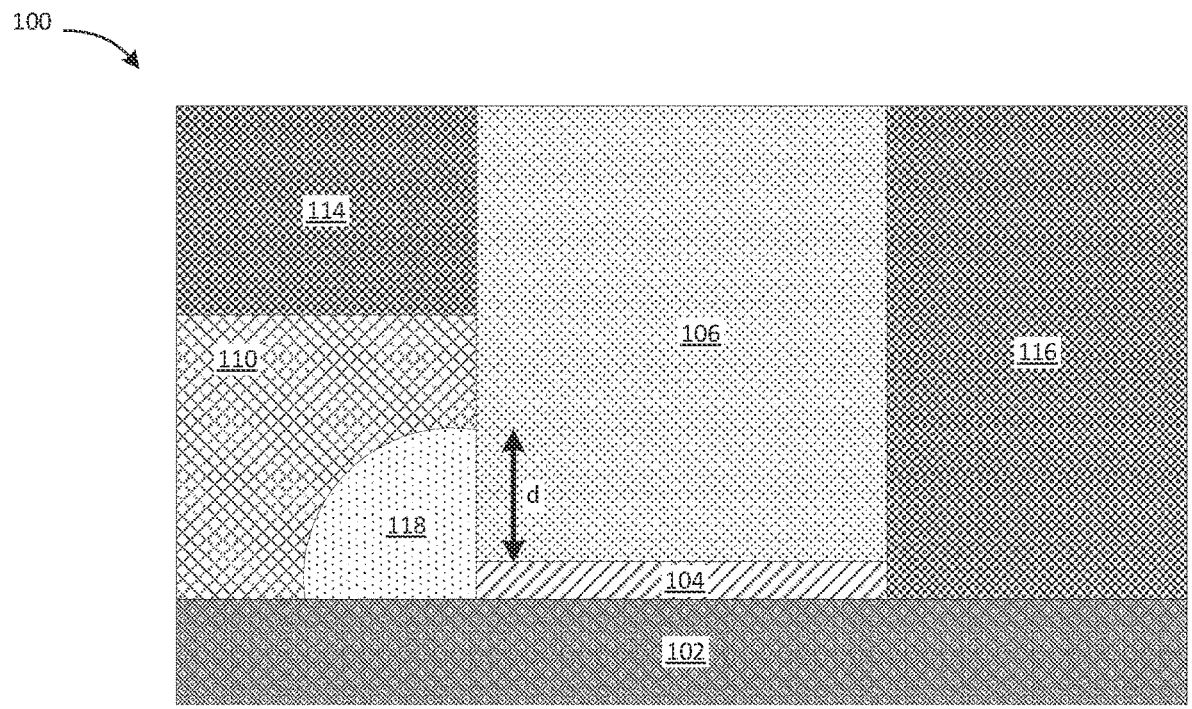
FIG. 8 is a cross-sectional view of the semiconductor device of FIG. 7 after additional fabrication operations, according to embodiments.

Referring now to FIG. 8, this figure is a cross-sectional view of the PCM memory cell 100 of FIG. 7 after a portion 118 of the PCM layer 110 has been converted into an amorphous state. The remainder of the PCM layer 110 is in a crystalline state. As mentioned above, memory switching in these materials is primarily a thermal process, which involves a phase transformation from a crystalline to an amorphous state, and vice versa, under the influence of a heat source (i.e., the TiN layer or the heater 104). When the heating process stops, the material of the phase change layer 110 retains its new state, thus exhibiting memory (the SET operation). In practice, this transformation is achieved by passing a current through the sample for some time. The transition to an amorphous state (the RESET operation) occurs by resistive heating up to the local melting point of the phase change layer 110 to produce the amorphous portion 118 shown in FIG. 8. To switch back to the low resistance crystalline state (the SET operation), a lower and longer pulse may be applied. The resistance of the PCM memory cell 100 is proportional to the distance (d) between the edge of the heater to the edge of the amorphous dome (which corresponds to the mushroom shaped cell). Moreover, the energy required to melt the PCM cell is proportional of the volume of the amorphous dome ($\sim d^3$). The present embodiments may allow for a reduction in the amount of energy required to melt the PCM cell by reducing the volume of the amorphous dome corresponding the portion 118. The present embodiments provide a lateral mushroom shaped cell with only about half of the mushroom PCM material needed to melt (i.e., compared to a related device that uses a full mushroom shape), while still achieving a comparable reset resistance. With a relatively smaller volume of PCM material to be melted, less current (energy) is required, and therefore a smaller transistor may be used (which translates to a smaller PCM cell size). In general, a full mushroom shape generally refers to a truncated spherical shape (essentially a sphere with a planar bottom portion). The present embodiments relate to a half mushroom shape, which is generally the full mushroom shape bisected in half.

Figure 9:
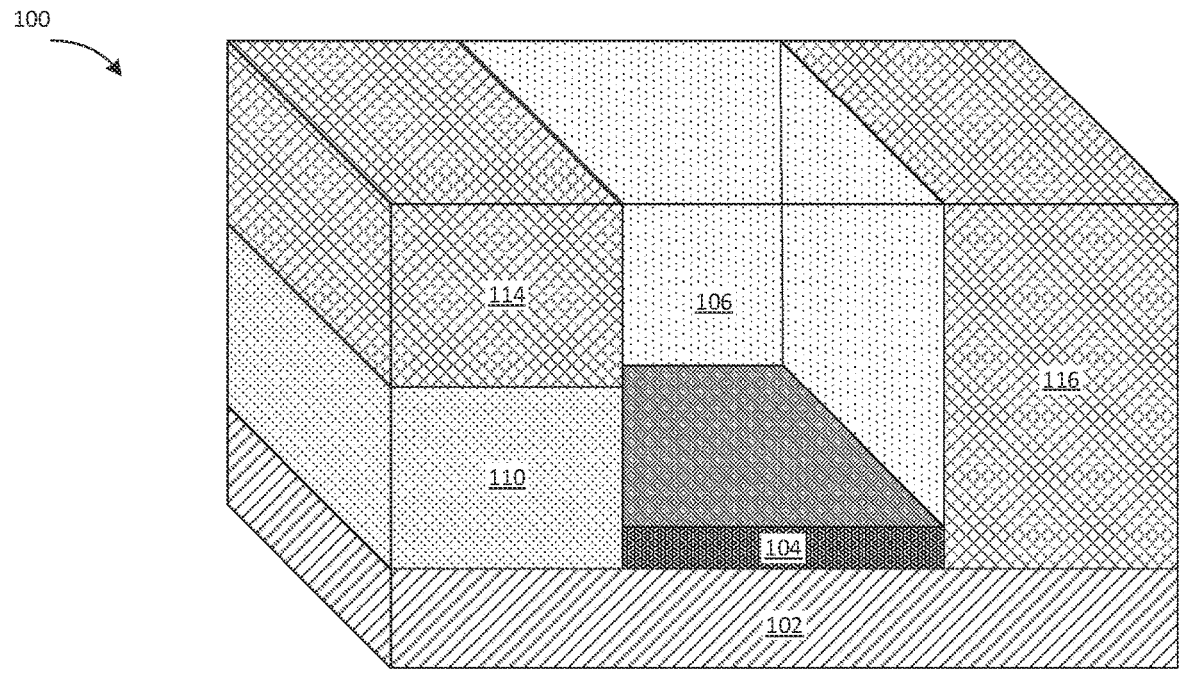
FIG. 9 is a perspective view of the semiconductor device of FIG. 7, according to embodiments.
Figure 10:
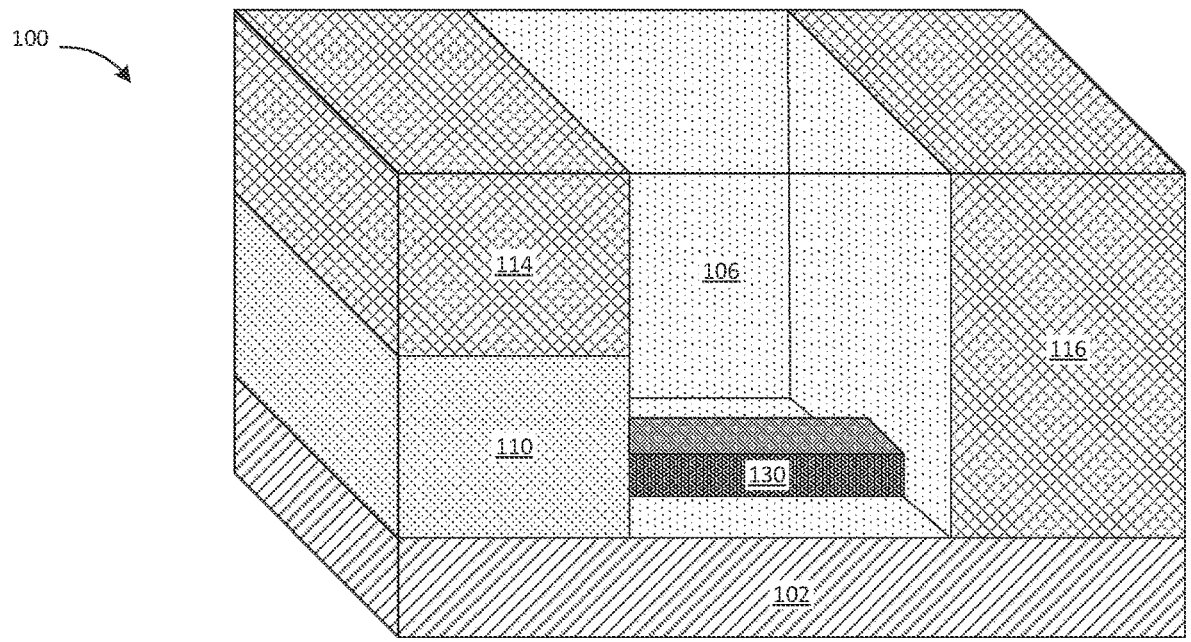
FIG. 10 is a perspective view of a semiconductor device, including a nanowire-shaped heating element, according to embodiments.

Referring now to FIG. 9, this figure is a perspective view of the PCM memory cell 100 of FIG. 7. In an alternate embodiment, as shown in FIG. 10, the heater 130 may be formed into a nanowire shape prior to forming the PCM layer 110, the first electrode 114, and the second electrode 116. In this embodiment, the heater 130 has a stripe shape and is formed along a central portion of the substrate 102. Other shapes of the heater may be suitable as well.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a phase change memory (PCM) device, the method comprising:
   forming a heater on a substrate;
   forming a hardmask to cover a top surface of the heater;
   forming a phase change material layer on and contacting a first lateral side of the heater;
   forming a first electrode on the phase change material layer on the first lateral side of the heater; and
   forming a second electrode on the substrate on a second lateral side of the heater, the second electrode contacting both the heater and the hardmask,
   wherein the PCM device is configured such that contact between the first lateral side of the heater and a lower lateral side portion of the phase change material layer enables formation of an amorphous portion of the phase change material layer having a half mushroom shape when performing a RESET operation with resistive heating.

2. The method according to claim 1, wherein the heater has a stripe shape and is formed along a central portion of the substrate.

3. The method according to claim 1, wherein a height of the amorphous portion of the phase change material layer is greater than a height of the heater.

4. The method according to claim 1, wherein the heater comprises at least one selected from the group consisting of titanium nitride (TiN), silicon carbide (SiC), graphite, tantalum nitride (TaN), tungsten nitride (WN), titanium tungsten (TiW), and titanium aluminide (TiAl).

5. The method according to claim 1, wherein the hardmask comprises at least one selected from the group consisting of SiN, a silicon oxynitride (SiON), a silicon carbonitride (SiCN), a silicon boronitride (SiBN), a silicon borocarbide (SiBC), a silicon boro carbonitride (SiBCN), a boron carbide (BC), and a boron nitride (BN).

6. The method according to claim 1, wherein the phase change material layer includes at least one selected from the group consisting of GeSe, AsS, SbTe and $In_2Se_3GeAsTe$, or GeSbTe (GST).

7. The method according to claim 1, wherein the phase change material layer is doped with at least one selected from the group consisting of aluminum oxide ($Al_2O_3$), silicon oxide ($SiO_2$), (tantalum oxide ($Ta_2O_5$), hafnium oxide ($HfO_2$), zirconium oxide ($ZrO_2$), cerium oxide ($CeO_2$), silicon nitride (SiN), and silicon oxynitride (SiON).

8. The method according to claim 1, wherein a thickness of the first electrode is less than a thickness of the second electrode.

9. The method according to claim 1, wherein the phase change material layer comprises GST.

10. A semiconductor device comprising:
    a heater on a substrate;
    a hardmask covering a top surface of the heater;
    a phase change material layer on and contacting a first lateral side of the heater;
    a first electrode on the phase change material layer on the first lateral side of the heater; and
    a second electrode on the substrate on a second lateral side of the heater, the second electrode contacting both the heater and the hardmask,
    wherein the PCM device is configured such that contact between the first lateral side of the heater and a lower lateral side portion of the phase change material layer enables formation of an amorphous portion of the phase change material layer having a half mushroom shape when performing a RESET operation with resistive heating.

11. The semiconductor device according to claim 10, wherein the heater has a stripe shape and is formed along a central portion of the substrate.

12. The semiconductor device according to claim 10, wherein a height of the amorphous portion of the phase change material layer is greater than a height of the heater.

13. The semiconductor device according to claim 10, wherein the heater comprises at least one selected from the group consisting of titanium nitride (TiN), silicon carbide (SiC), graphite, tantalum nitride (TaN), tungsten nitride (WN), titanium tungsten (TiW), and titanium aluminide (TiAl).

14. The semiconductor device according to claim 10, wherein the hardmask comprises at least one selected from the group consisting of SiN, a silicon oxynitride (SiON), a silicon carbonitride (SiCN), a silicon boronitride (SiBN), a silicon borocarbide (SiBC), a silicon boro carbonitride (SiBCN), a boron carbide (BC), and a boron nitride (BN).

15. The semiconductor device according to claim 10, wherein the phase change material layer includes at least one selected from the group consisting of GeSe, AsS, SbTe and $In_2Se_3GeAsTe$, or GeSbTe (GST).

16. The semiconductor device according to claim 10, wherein the phase change material layer is doped with at least one selected from the group consisting of aluminum oxide ($Al_2O_3$), silicon oxide ($SiO_2$), (tantalum oxide ($Ta_2O_5$), hafnium oxide ($HfO_2$), zirconium oxide ($ZrO_2$), cerium oxide ($CeO_2$), silicon nitride (SiN), and silicon oxynitride (SiON).

17. The semiconductor device according to claim 10, wherein a thickness of the first electrode is less than a thickness of the second electrode.

18. The semiconductor device according to claim 10, wherein the phase change material layer comprises GST.

* * * * *